United States Patent
Ang et al.

(10) Patent No.: US 6,995,564 B1
(45) Date of Patent: Feb. 7, 2006

(54) METHOD AND SYSTEM FOR LOCATING CHIP-LEVEL DEFECTS THROUGH EMISSION IMAGING OF A SEMICONDUCTOR DEVICE

(75) Inventors: Boon Y. Ang, Cupertino, CA (US); Mehrdad Mahanpour, Union City, CA (US); Mohammed Massoodi, Los Altos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 99 days.

(21) Appl. No.: 10/346,463

(22) Filed: Jan. 15, 2003

(51) Int. Cl.
*G01R 31/00* (2006.01)
*G01R 31/28* (2006.01)
*G06K 9/20* (2006.01)

(52) U.S. Cl. ............ 324/501; 324/752; 324/763; 382/145; 382/312; 250/311

(58) Field of Classification Search .......... 324/501, 324/750–765; 382/312
See application file for complete search history.

(56) References Cited

U.S. PATENT DOCUMENTS

| | | | | |
|---|---|---|---|---|
| 4,820,975 A | * | 4/1989 | Diggle | 324/758 |
| 5,493,236 A | * | 2/1996 | Ishii et al. | 324/752 |
| 5,940,545 A | * | 8/1999 | Kash et al. | 382/312 |
| 6,172,512 B1 | * | 1/2001 | Evans et al. | 324/752 |
| 6,469,528 B2 | * | 10/2002 | Akikuni et al. | 324/752 |
| 6,483,326 B1 | * | 11/2002 | Bruce et al. | 324/751 |
| 6,515,494 B1 | * | 2/2003 | Low | 324/752 |
| 6,590,409 B1 | * | 7/2003 | Hsiung et al. | 324/765 |
| 6,653,849 B1 | * | 11/2003 | Bruce et al. | 324/751 |
| 6,774,647 B2 | * | 8/2004 | Kash et al. | 324/752 |
| 2004/0103353 A1 | * | 5/2004 | Koyama et al. | 714/724 |

* cited by examiner

*Primary Examiner*—Vinh Nguyen
*Assistant Examiner*—Emily Y Chan
(74) *Attorney, Agent, or Firm*—Winstead Sechrest & Minick P.C.

(57) ABSTRACT

Aspects for locating chip-level defects through emission imaging of a semiconductor device are described. The aspects include providing a semiconductor device for inspection within an emission imaging system. Emission detection from a frontside and backside of the semiconductor device substantially simultaneously is then performed in the emission imaging system, wherein the emissions detected indicate potential defects within the semiconductor device.

7 Claims, 1 Drawing Sheet

METHOD AND SYSTEM FOR LOCATING CHIP-LEVEL DEFECTS THROUGH EMISSION IMAGING OF A SEMICONDUCTOR DEVICE

FIELD OF THE INVENTION

The present invention relates to locating chip-level defects through emission imaging of a semiconductor device.

BACKGROUND OF THE INVENTION

As the manufacturing processes for semiconductor devices and integrated circuits increase in difficulty, methods for manufacturing, testing and debugging these devices become increasingly important. Not only is it important to ensure that individual chips are functional, it is also important to ensure that batches of chips perform consistently. In addition, the ability to detect a defective manufacturing process early is helpful for reducing the possibility of manufacturing a defective device. It is also helpful to be able to perform the manufacture, testing and debugging of integrated circuits in an efficient and timely manner.

Locating chip-level defects is an important aspect of the testing and debugging procedure. Emission microscopy has long been used to locate chip-level defects by detecting the energy they emit, e.g., infrared light, heat, etc. Emission images generally contain an image showing the circuitry of the device superimposed with the image of the light emitted by the defect(s) to determine a location of a chip-level defect.

While images originally were formed from frontside emissions, as technology has evolved and circuits have been designed with more and more metallization and interconnection layers, the ability to detect all emissions from the frontside has been hampered since some of the emissions cannot pass through the metallization layers. Thus, a shift has occurred in emission imaging to form the images from the backside of the devices. While backside imaging has had a level of success, special considerations are required for the upside-down manner in which the circuitry must be held, probed, and imaged. Thus, viewing emissions from a single side, frontside or backside, has drawbacks.

Accordingly, a need exists for an improved approach to locating chip-level defects through emission imaging. The present invention addresses such a need.

SUMMARY OF THE INVENTION

Aspects for locating chip-level defects through emission imaging of a semiconductor device are provided. The aspects include providing a semiconductor device for inspection within an emission imaging system. Emission detection from a frontside and backside of the semiconductor device substantially simultaneously is then performed in the emission imaging system, wherein the emissions detected indicate potential defects within the semiconductor device.

With the present invention, the ability to locate chip-level defects is improved by detecting both frontside and backside emissions in a semiconductor device. The improvements are achieved by enhancing typical approaches to emission imaging in a straightforward and efficient manner. These and other advantages will become readily apparent from the following detailed description and accompanying drawings.

DETAILED DESCRIPTION OF THE INVENTION

The present invention relates to locating chip-level defects through emission imaging of a semiconductor device. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
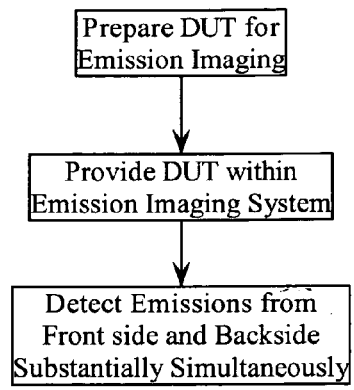
FIG. 1 illustrates a block flow diagram of a method for locating chip-level defects through emission imaging in accordance with the present invention.
Figures 2, 3:
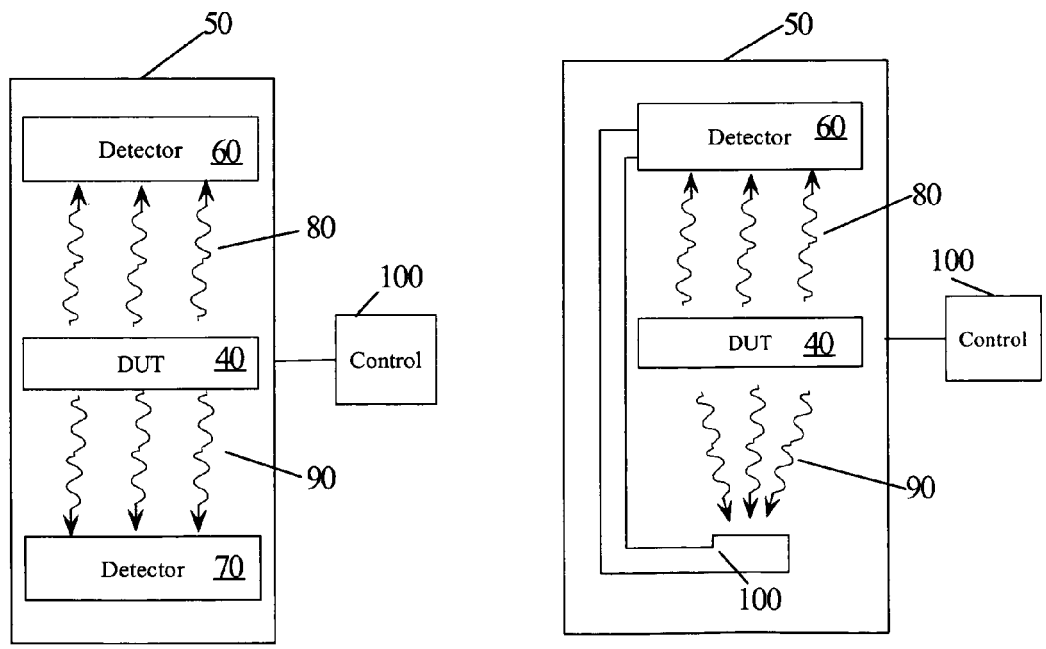
FIGS. 2 and 3 illustrate alternate embodiments of a system in accordance with the present invention.

In accordance with the present invention, emission detection, e.g., infrared light, heat, etc., occurs from both a backside and a frontside of a semiconductor multilayer sample substantially simultaneously, as described with reference to FIGS. 1, 2, and 3. FIG. 1 illustrates a block diagram of an overall method of emission detection in accordance with the present invention, while FIGS. 2 and 3 illustrate alternate system embodiments to perform the method of FIG. 1.

The present invention follows substantially a typical approach to emission detection. Thus, the detection initiates with a preparation of the device under test (DUT), e.g., a multilayer semiconductor chip, for emission imaging (step 10). As is normally performed, the DUT preparation includes some level of thinning down of the backside (e.g., silicon substrate) of the DUT, such as through backgrind or TMAH wet etch techniques, so that emissions can escape more readily from the backside. Once prepared, the DUT is positioned within the emission detection system (step 20). It should be appreciated that the positioning can be performed in any desired configuration so as to allow frontside and backside emission detection, including horizontal, vertical, etc. The process then continues with detection of both backside and frontside emissions substantially simultaneously (step 30).

In order to detect both backside and frontside emissions substantially simultaneously, preferably a typical detection system, such as emission microscopy devices available from various companies, including HyperVision, Inc. of Fremont, Calif., is enhanced. Referring to FIG. 2, a basic block diagram illustrates a DUT 40 positioned for imaging within an enclosed detection chamber 50. In order to detect emissions from both the backside and frontside of the DUT 40, a first embodiment includes a first detector 60 and a second detector 70 positioned to be able to detect the frontside emissions, shown as arrows 80, and backside emissions, shown as arrows 90. By way of example, the detectors 60 and 70 include an image capturing device, such as a CCD.

Control system 100 provides typical controls for activating the DUT 40, including controlling power-up of the DUT 40 and probing with a probe card (not shown). Control system 100 includes a computer system or other suitable mechanism to provide the controls and for data storage and processing of the emission data received from the detectors 60 and 70, as well as including an output mechanism, e.g., a display screen, printer, etc., for viewing the emission data processed, as is well appreciated by those skilled in the art. In addition to processing emission data, the control system 100 further controls capture of an illuminated image of the DUT 40 that indicates the layout of the DUT 40 and is superimposed with the emission image data to locate defects in the DUT 40, as is commonly understood in the art.

In an alternate embodiment, as shown in FIG. 3, frontside and backside emission detection occurs with a single detector 60, but the detector 60 is linked to the backside of the DUT 40 via an optical fiber connection 110 that channel the emissions from the backside. Control over the processing of the data occurs via the control system 100 according to appropriate data processing, the details of which are beyond the scope of the present invention.

By detecting emissions in the form of heat, infrared, etc. from both the frontside and backside of a semiconductor device under test and superimposing the emission signals in accordance with the present invention, the ability of detecting electrical faults is improved. Further, the present invention is particularly useful and advantageous for devices with numerous layers of interconnects.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A method for locating chip-level defects through emission imaging of a semiconductor device, the method comprising:
   providing a semiconductor device for inspection within an emission imaging system; and
   performing emission detection from a frontside and backside of the semiconductor device substantially simultaneously in the emission imaging system, wherein the emissions detected indicate potential defects within the semiconductor device;
   wherein performing emission detection further comprises utilizing a detector to detect emissions from both the frontside and backside of the semiconductor device.

2. The method of claim 1 further comprising utilizing the detector above the frontside and transmitting emissions from the backside of the semiconductor device to the detector with an optical fiber.

3. A system for locating chip-level defects through emission imaging of a semiconductor device the system comprising:
   a semiconductor device having a frontside and a backside; and
   an emission imaging system, the emission imaging system for forming an emission image of the semiconductor device by detecting emissions from the frontside and backside substantially simultaneously indicative of potential defects within the semiconductor device;
   wherein the emission imaging system further comprises a detector to detect emissions from both the frontside and backside of the semiconductor device.

4. The system of claim 3 wherein the detector detects emissions from above the frontside and detects emissions from the backside transmitted through an optical fiber coupled to the detector.

5. A method for locating chip-level defects through emission imaging of a semiconductor device, the method comprising:
   preparing a semiconductor device for emission imaging from a backside of the semiconductor device;
   positioning the semiconductor device in an emission imaging system; and
   detecting emissions from the backside and a frontside of the semiconductor device substantially simultaneously in the emission imaging system;
   wherein detecting emissions further comprises utilizing a detector to detect emissions from both the frontside and backside of the semiconductor device.

6. The method of claim 5 further comprising utilizing the detector above the frontside and transmitting emissions from the backside of the semiconductor device to the detector with an optical fiber.

7. A method for locating chip-level defects through emission imaging of a semiconductor device, the method comprising:
   preparing a semiconductor device for emission imaging from a backside of the semiconductor device;
   positioning the semiconductor device in an emission imaging system; and
   detecting emissions from the backside and a frontside of the semiconductor device substantially simultaneously in the emission imaging system;
   wherein preparing a semiconductor device further comprises thinning down the backside.

* * * * *